United States Patent
Winter

(10) Patent No.: US 9,793,224 B2
(45) Date of Patent: Oct. 17, 2017

(54) CRACK STOP BARRIER AND METHOD OF MANUFACTURING THEREOF

(71) Applicant: Infineon Technologies AG, Neubiberg (DE)

(72) Inventor: Sylvia Baumann Winter, Laussnitz (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/975,607

(22) Filed: Dec. 18, 2015

(65) Prior Publication Data

US 2016/0104682 A1    Apr. 14, 2016

Related U.S. Application Data

(60) Continuation of application No. 14/184,529, filed on Feb. 19, 2014, now Pat. No. 9,245,801, which is a division of application No. 12/898,468, filed on Oct. 5, 2010, now Pat. No. 8,692,392.

(51) Int. Cl.
| | |
|---|---|
| *H01L 23/00* | (2006.01) |
| *H01L 23/544* | (2006.01) |
| *H01L 23/58* | (2006.01) |
| *H01L 21/78* | (2006.01) |

(52) U.S. Cl.
CPC .......... *H01L 23/562* (2013.01); *H01L 21/78* (2013.01); *H01L 23/544* (2013.01); *H01L 23/585* (2013.01); *H01L 2223/5446* (2013.01); *H01L 2223/54426* (2013.01); *H01L 2924/0002* (2013.01)

(58) Field of Classification Search
CPC ............ H01L 21/78; H01L 2223/5446; H01L 23/562; H01L 23/585
See application file for complete search history.

(56) References Cited

U.S. PATENT DOCUMENTS

| | | | |
|---|---|---|---|
| 5,834,829 A | 11/1998 | Dinkel et al. | |
| 6,972,444 B1 | 12/2005 | Iacob | |
| 7,741,715 B2 | 6/2010 | Kim et al. | |
| 7,960,814 B2 | 6/2011 | Vo | |
| 8,680,653 B2 | 3/2014 | Miccoli et al. | |
| 2002/0130394 A1 | 9/2002 | Toyoda | |
| 2006/0001144 A1 | 1/2006 | Uehling et al. | |
| 2008/0265378 A1 | 10/2008 | Lee et al. | |
| 2009/0039470 A1 | 2/2009 | Vo | |
| 2009/0272973 A1 | 11/2009 | Yoshida et al. | |
| 2010/0025824 A1* | 2/2010 | Chen ................. | H01L 23/585 257/620 |
| 2010/0072578 A1 | 3/2010 | Kunishima | |
| 2010/0133669 A1 | 6/2010 | Jao | |

FOREIGN PATENT DOCUMENTS

| | | |
|---|---|---|
| CN | 101459180 A | 6/2009 |
| CN | 101685817 A | 3/2010 |
| CN | 101779286 A | 7/2010 |
| DE | 102008049059 | 5/2009 |

* cited by examiner

Primary Examiner — Tucker J Wright
(74) Attorney, Agent, or Firm — Slater Matsil, LLP

(57) ABSTRACT

A wafer is disclosed. The wafer comprises a plurality of chips and a plurality of kerfs. A kerf of the plurality of kerfs separates one chip from another chip. The kerf comprises a crack stop barrier.

25 Claims, 5 Drawing Sheets

CRACK STOP BARRIER AND METHOD OF MANUFACTURING THEREOF

This application is a continuation of Ser. No. 14/184,529 filed on Feb. 19, 2014, which is a divisional application of U.S. application Ser. No. 12/898,468 filed on Oct. 5, 2010 (U.S. Pat. No. 8,692,392). Both applications are incorporated herein by reference.

TECHNICAL FIELD

The present invention relates generally to the manufacture of semiconductor devices and more particularly to the manufacture chips by separating semiconductor wafers and semiconductor wafers having crack stop barriers.

BACKGROUND

Dozens or hundreds of integrated circuits are typically manufactured on a single semiconductor wafer. The semiconductor wafer comprises chips or dies in which the integrated circuits are located, and kerfs or scribe lines which separate the individual chips. The individual chips are diced by sawing the wafer along the kerf. The individual chips are then typically packaged, either separately or in a multi-chip module.

SUMMARY OF THE INVENTION

In accordance with an embodiment of the present invention, a wafer is disclosed. The wafer comprises a plurality of chips and a plurality of kerfs. A kerf of the plurality of kerfs separates one chip from another chip. The kerf comprises a crack stop barrier.

In accordance with an embodiment of the present invention, a method of manufacturing chips is disclosed. The method comprises applying a chip design to chips of a wafer and applying a kerf design to the kerf of the wafer. The kerf design comprises a crack stop barrier. The method further comprises dicing the wafer to separate the chips.

The foregoing has outlined rather broadly the features and technical advantages of embodiments of the present invention in order that the detailed description of the invention that follows may be better understood. Additional features and advantages of embodiments of the invention will be descried hereinafter, which form the subject of the claims of the invention. It should be appreciated by those skilled in the art that the conception and specific embodiments disclosed may be readily utilized as a basis for modifying or designing other structures or processes for carrying out the same purpose of the present invention. It should be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a crack stop barrier in a kerf or on a semiconductor wafer.

Figure 1:
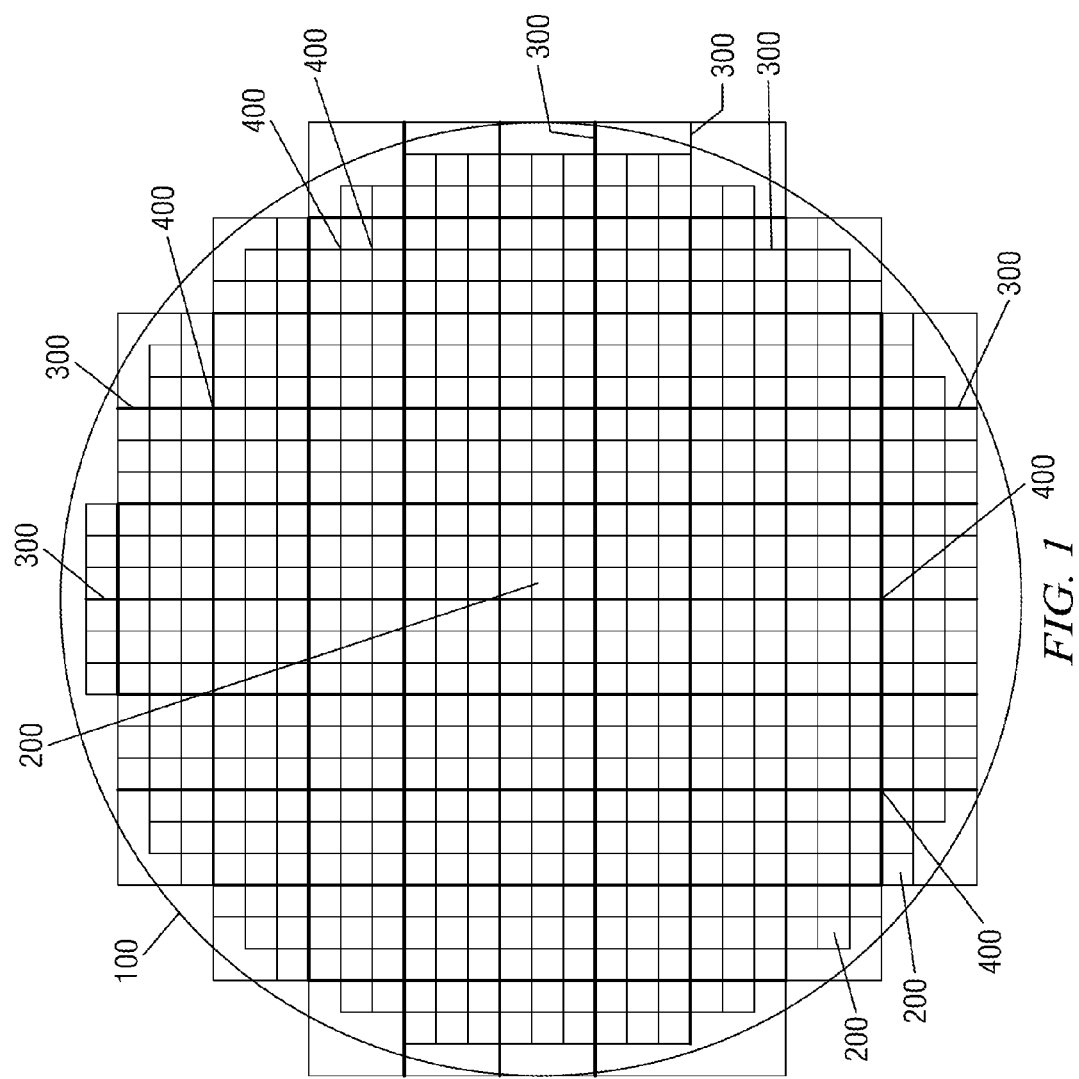
FIG. 1 shows a wafer.

FIG. 1 shows a wafer 100 comprising a plurality of chips or dies 200 and a plurality of kerfs or scribe lines 300. Each chip 200 may be separated from other chips 200 by kerfs or scribe lines 300. The intersections of the kerfs 300 may form kerf junctions 400.

The kerfs 300 may comprise test features such as optical alignment structures, process control monitoring structures, and/or reliability control monitoring structures. The test features may be short features having a structure shorter than a chip length or long features having structures longer than a chip length. The long test features may extend in or beyond a kerf junction 400 or a plurality of kerf junctions 400. The test features may extend beyond several junctions 400 and may be arranged along a long or short side of several chips.

Figure 2:
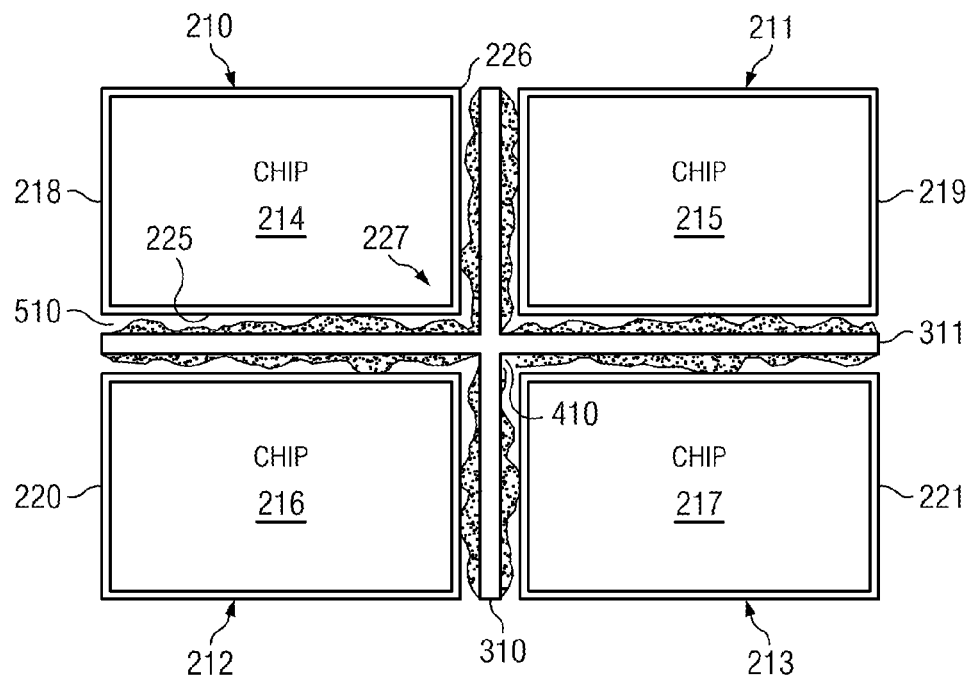
FIG. 2 shows a conventional kerf junction.

FIG. 2 shows a detail of a conventional wafer 100. Four chips 210-213 are shown. The chips 210-213 are separated by kerfs 310 and 311. The kerfs 310 and 311 form a kerf junction 410. Each chip 210-213 may comprise an inner region 214-217 within the respective chip 210-213. The inner region 214-217 may be an integrated circuit region. The integrated circuit region 214-217 may be enclosed or surrounded by a seal or crack stop ring located in a peripheral region 218-221 of the chip 210-213. The crack stop ring is supposed to prevent cracks or delamination from propagating toward the integrated circuit 214-217 of the chips 210-213 while the chips 210-213 are separated by sawing the kerf. The kerf junction 410 may be a square or a rectangle.

FIG. 2 shows a shaded region 510. The shaded region 510 shows the propagation of cracks while the chips 210-213 are separated. As can be seen from FIG. 2, the crack stop rings of the peripheral regions 218-221 may prevent delamination or propagation of the cracks toward the integrated circuits region 214-217 along a long side 225 and along a short side 226 of chip 210, for example. However, the crack stop rings of the peripheral regions 218-221 may not be able to prevent delamination or propagation of cracks at a corner 227 of the chip 210. The corner 227 of the chip 210 may be more vulnerable to delamination and cracks because the corner 227 may be more exposed to separation forces than the long side 225 and/or the short side 226 of chip 210. In a particular example, the corner 227 may be exposed to separation forces not only from one direction but from two directions.

A problem may occur when the corner 227 cannot stop propagations of cracks. Cracks may enter the inner regions 214-217 of the chips 210-213 damaging the integrated circuit regions 214-217 and leading to device failures. The cracks can disrupt conductive lines rendering the integrated circuits 214-217 inoperable. The cracks can also allow moisture and other contaminants to enter into the integrated circuit region 214-217 of the chips 210-213, causing corrosion and other problems.

Thus, what is needed in the art is an arrangement that prevent cracks propagating into the integrated circuit regions 214-217 of the chips 210-213 while separating the chips 210-213.

Figure 3:
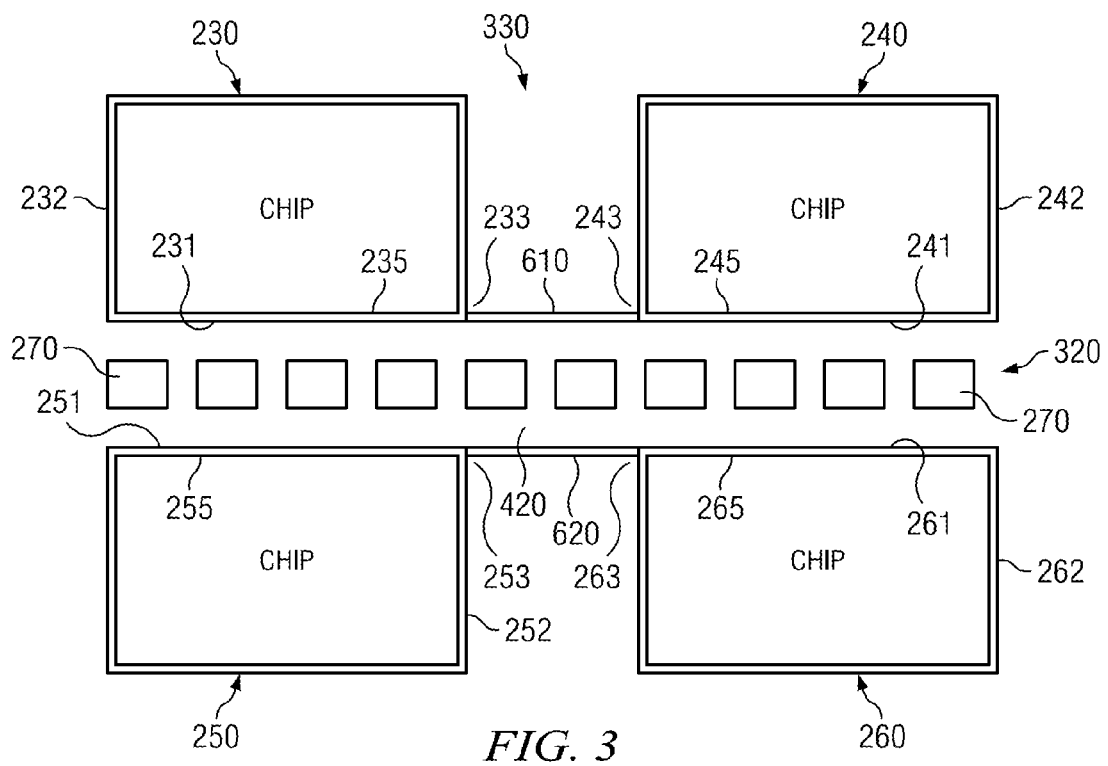
FIG. 3 shows a top view of an embodiment of a kerf junction.

FIG. 3 shows a top view of an embodiment of a detail of a wafer 100. FIG. 3 shows four chips, i.e. a first chip 230, a second chip 240, a third chip 250 and a fourth chip 260. The chips 230-260 may be memory chips or logic chips. For example, the chips 230-260 may be DRAM chips, non-volatile memory chips, microcontroller chips and the like. FIG. 3 further shows two perpendicular scribe lines 320, 330. The two scribe lines 320, 330 form a kerf or scribe line junction 420. Two crack stop barriers 610, 620 are arranged in the scribe line junction 420. The crack stop barriers 610, 620 are arranged parallel to the first kerf 320 direction and orthogonal to a second kerf 330 direction. The crack stop barriers 610, 620 are arranged on opposite sides of the kerf junction 420. The crack stop barriers 610, 620 may block a propagation of cracks along the second kerf 330 direction. The crack stop barriers 610, 620 may not block a propagation of cracks along the first kerf 320 direction.

The first crack stop barrier 610 is arranged between the first chip 230 and a second chip 240, and the second crack stop barrier 620 is arranged between the third chip 250 and the fourth chip 260. The first crack stop barrier 610 may be in line with a long side 231 of the first chip 230 and a long side 241 of the second chip 240, and the second crack stop barrier 620 is in line with a long side 251 of the third chip 250 and a long side of 261 the fourth chip 260. The first crack stop barrier 610 is an extension of corners 233, 243 of a first chip 230 and a second chip 240. The second crack stop barrier 620 is an extension of corners 253, 263 of a third chip 250 and a fourth chip 260. The first crack stop barrier 610 is orthogonal to a short side 232 of the first chip 230 and a short side 242 of the second chip 240, and the second crack stop barrier 620 is orthogonal to a short side 252 of the third chip 250 and a short side 262 of the fourth chip 260. In one embodiment the crack stop barrier 610, 620 may be arranged in line with a short side 232-262 of the chip 230-260 and orthogonal to a long side 231-251 of the chip 230-260.

In one embodiment the crack stop barrier 610, 620 may be in line with or parallel to features 270 located in and along the first kerf 320 or the second kerf 330. The features 270 may be test features such as optical alignment structures, process control monitoring (pcm) structures, and/or reliability control monitoring (rcm) structures. If the features 270 are located in and along the first kerf 320 then the crack stop barriers 610, 620 may be in line with the first kerf 320. If the features 270 are located in and along the second kerf 320 then the crack stop barriers 610, 620 may be in line with the second kerf 330. In one embodiment crack stop barriers 610, 620 may only be arranged in line with kerfs 320, 330 comprising features 270 longer than a length of one chip or features 270 crossing the junction 420.

The crack stop barrier 610 may be physically connected to the crack stop barriers 235, 245 of the chips 230, 240, and the crack stop barrier 620 may be physically connected to the crack stop barriers 255, 265 of the chips 250, 260. In one embodiment the crack stop barriers 610, 620 may block the entire width of the second kerf 330.

The crack stop barriers 610, 620 may be continuous lines. Alternatively, the crack stop barriers 610, 620 may be staggered discrete lines or jagged lines. The crack stop barriers 610, 620 may be sawtooth or zigzag lines. The crack stop barriers 610, 620 may be made from a solid material. A solid material may be a conductive or semiconductive material such as a metal, silicon or polysilicon, or, alternatively, a dielectric material such as silicon dioxide or high-k dielectrics.

The crack stop barriers 610, 620 may be a single barrier line or a plurality of barrier lines. For example, crack stop barriers 610, 620 each may be two barrier lines. Crack stop barrier 610 may have the same number of barrier lines as crack stop barrier 620. Alternatively, crack stop barrier 610 may have different numbers of barrier lines as crack stop barrier 620. For example, crack stop barrier 610 may comprise a single barrier line while crack stop barrier 620 may comprise a dual barrier line.

The crack stop barriers 610, 620 may comprise a width of about 3 µm to about 12 µm. The crack stop barrier lines of the crack stop barriers 610, 620 may comprise a width of about 0.5 µm to about 4 µm. The crack barrier lines may comprise a width of about 1 µm to about 3 µm.

Figure 4:
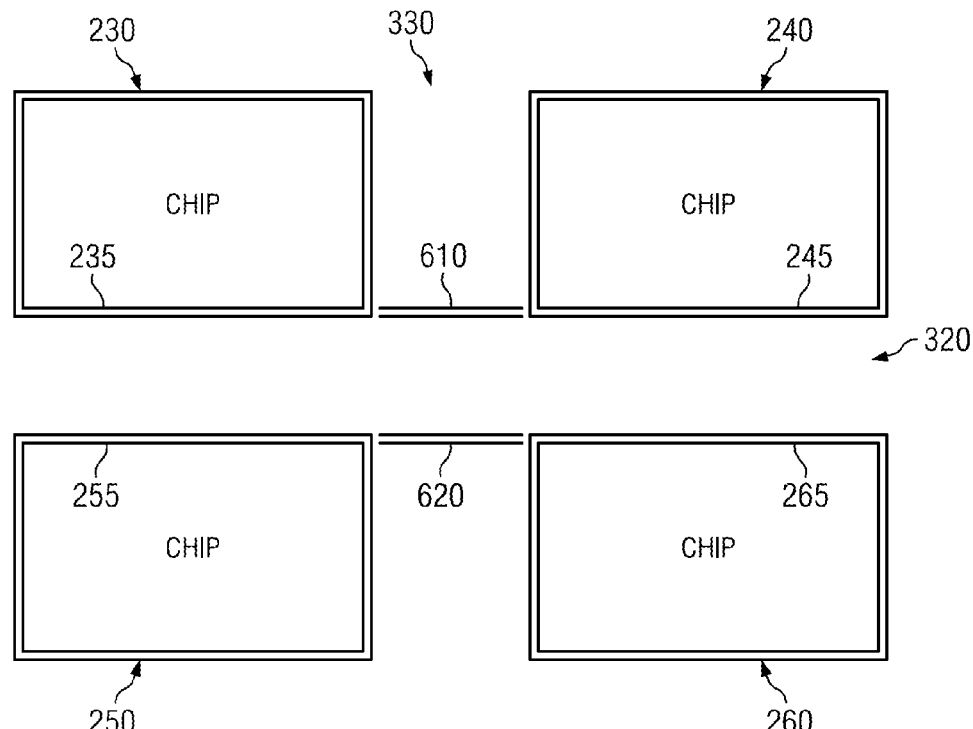
FIG. 4 shows a top view of an embodiment of a kerf junction.

FIG. 4 shows a top view of another embodiment of crack stop barriers 610, 620. The crack stop barriers 610, 620 may only block parts of the entire width of the second kerf 330. The crack stop barrier 610 may not be physically connected to the crack stop barriers 235, 245 of the chips 230, 240 and may be arranged in a distance or a gap from the crack stop barriers 235, 245 of the chips 230, 240. For example, the distance between the crack stop barriers 235, 245 of the chips 230, 240 and the crack stop barrier 610 may be about 1 µm to about 3 µm. Alternatively, the gap may be about 1.5 µm to about 2 µm. Crack stop barrier 620 may be placed at a same or a similar distance from the crack stop barriers 255, 265 of the chips 250, 260 as crack stop barrier 610 from the crack stop barriers 235, 245. Alternatively, the crack stop barrier 620 may be placed at a different distance from the crack stop barriers 255, 265 of the chips 250, 260 than crack stop barrier 610 from the crack stop barriers 235, 245.

Figure 5:
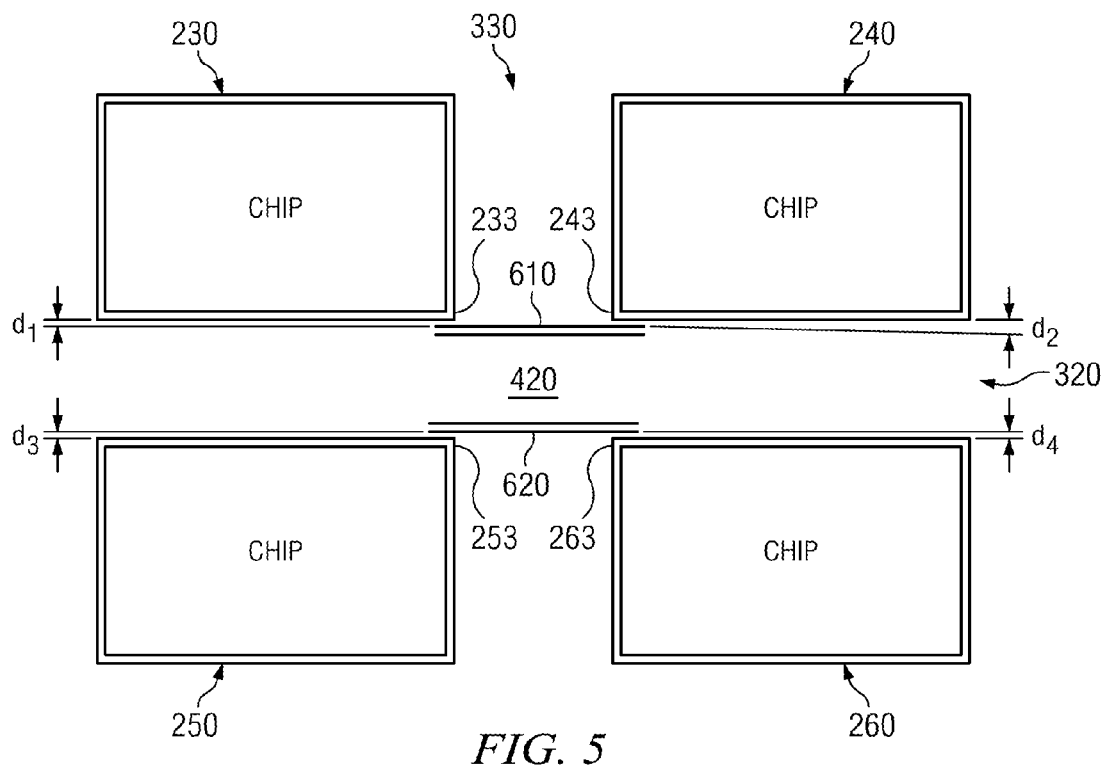
FIG. 5 shows a top view of an embodiment of a kerf junction.

FIG. 5 shows a top view of another embodiment of crack stop barriers 610, 620. The crack stop barriers 610, 620 are located at least partially within the kerf junction 420. The crack stop barriers 610, 620 may be located at a peripheral region of the square or the rectangle of the kerf junction 420. The crack stop barriers 610, 620 may be located in the first kerf 320 and in the second kerf 330.

The crack stop barrier 610 may be placed at a first distance $d_1$ from an edge 233 of the first chip 230 and a second distance $d_2$ form the edge 243 of the first chip 240. Distance $d_1$ and distance $d_2$ may be the same or may be different. For example, distance $d_1$ may be about 2 µm to about 5 µm. The crack stop barrier 620 may be placed at a third distance $d_3$ from an edge 253 of the third chip 250 and a fourth distance $d_4$ form the edge 263 of the fourth chip 260. Distance $d_3$ and distance $d_4$ may be the same or may be different. Distance $d_1$ and distance $d_3$ may be the same or may be different, and distance $d_2$ and distance $d_4$ may be the same or may be different. All the distances $d_1$-$d_4$ may be the same or different.

The lengths of the crack stop barriers 610, 620 may be shorter, as large as or larger than the width of the kerf 330. The lengths of the crack stop barriers 610, 620 may be the same or may be different.

Figure 6:
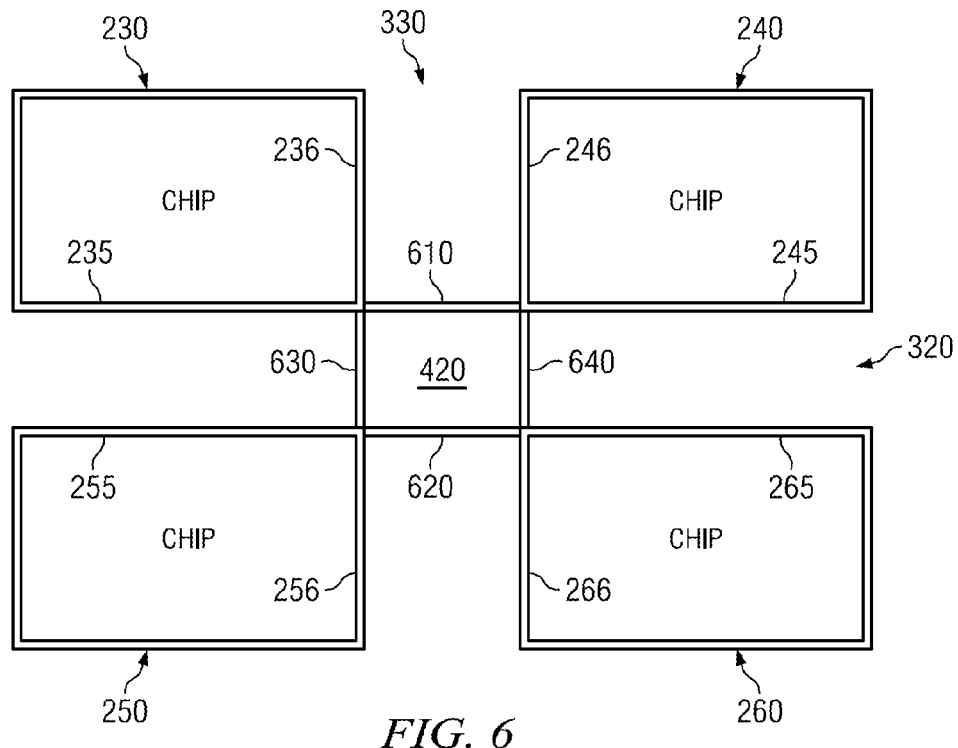
FIG. 6 shows a top view of an embodiment of a kerf junction.

FIG. 6 shows a top view of an embodiment of crack stop barriers 610-640. The crack stop barriers 610-640 are arranged along a perimeter of the kerf junction 420. The crack stop barrier 610 may be physically connected to the crack stop barriers 235, 245 of the chips 230, 240, and the crack stop barrier 620 may be physically connected to the crack stop barriers 255, 265 of the chips 250, 260. The crack stop barrier 630 may be physically connected to the crack stop barriers 236, 256 of the chips 230, 250, and the crack stop barrier 640 may be physically connected to the crack stop barriers 246, 266 of the chips 240, 260. In one embodiment the crack stop barriers 610-640 may block the entire widths of the kerfs 320, 330.

In another embodiment crack stop barriers 610-640 may only block parts of the entire width of the kerfs 320, 330. The crack stop barriers 610-640 may not be physically connected to the crack stop barriers 235-266 of the chips 230-260 and may be arranged in a distance or a gap from the crack stop barriers 235-266 of the chips 230-260. In one embodiment some of the crack stop barriers 610-640 may be physically connected to the crack stop barriers 235-265 of the chips 230-260, and some of the crack stop barriers 610-640 may not be physically connected to the crack stop barriers 235-265 of the chips 230-260.

Figure 7:
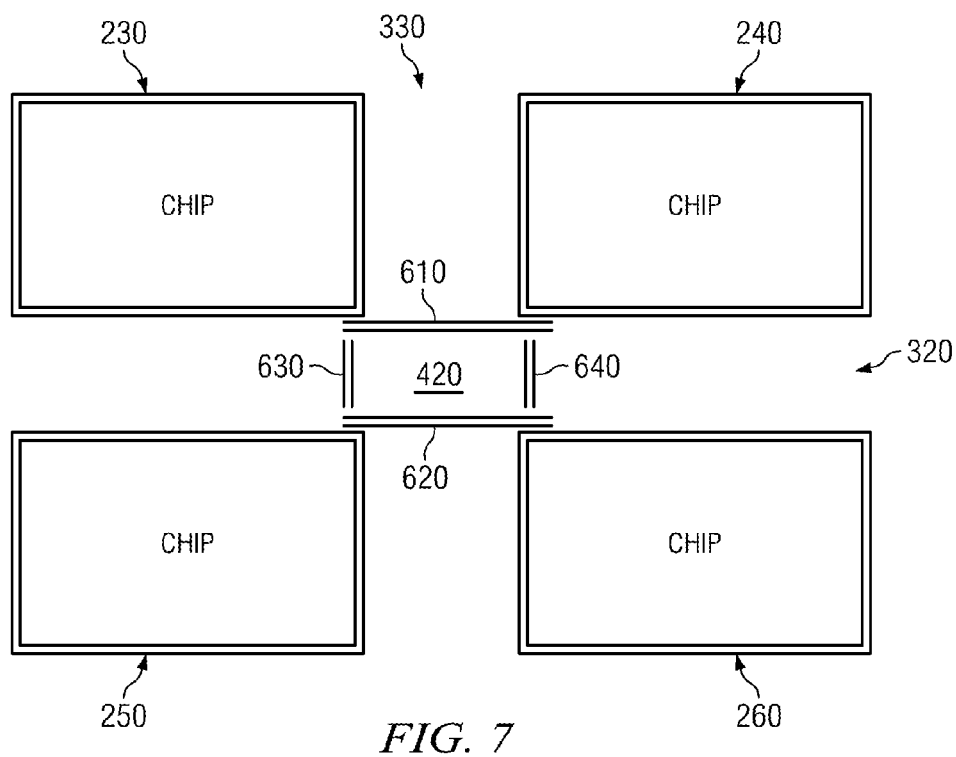
FIG. 7 shows a top view of an embodiment of a kerf junction.

FIG. 7 shows a top view of an embodiment of crack stop barriers 610-640. The crack stop barriers 610-640 are located at least partially within the kerf junction 420. The crack stop barriers 610-640 may be located at a peripheral region of the square or the rectangle of the kerf junction 420. The crack stop barriers 610-640 may be located in the first kerf 320 and in the second kerf 330. The crack stop barriers 610, 620 may be arranged parallel to the first kerf 320 direction, and the crack stop barriers 630, 640 may be arranged orthogonal to the first kerf 320 direction. The crack stop barriers 630, 640 may be arranged parallel to the second kerf 330 direction, and the crack stop barriers 610, 620 may be arranged orthogonal to the second kerf 330 direction. Similar to the discussion above with respect to FIG. 5, the crack stop barriers 610-640 may have the same distances from the edges 233-263 of the chips 230-260 or different distances from the edges 233-263 of the chips 230-260.

In the particular example of FIG. 7, the lengths of the barriers 610, 620 are larger than the width of the kerf 330, and the lengths of the barriers 630, 640 are shorter than the width of the kerf 320. In one embodiment the lengths of the crack stop barriers 610-640 all may be shorter than the widths of the kerfs 320, 330. In one embodiment the lengths of the crack stop barriers 610, 620 are the same and the lengths of the crack stop barriers 630, 640 are the same. In another embodiment the ratio (length of the crack stop barrier 610-640 relative to the width of the kerf 320, 330) is the same but the lengths of the crack stop barriers 610-640 are different. In yet another embodiment the lengths of the crack stop barriers 610-640 may be shorter, as large as or larger than the width of the kerfs 320, 330.

The crack stop barriers 610-640 may comprise the same material, designs, widths, and distances as described for the crack stop barriers with respect to FIG. 3.

Figure 8:
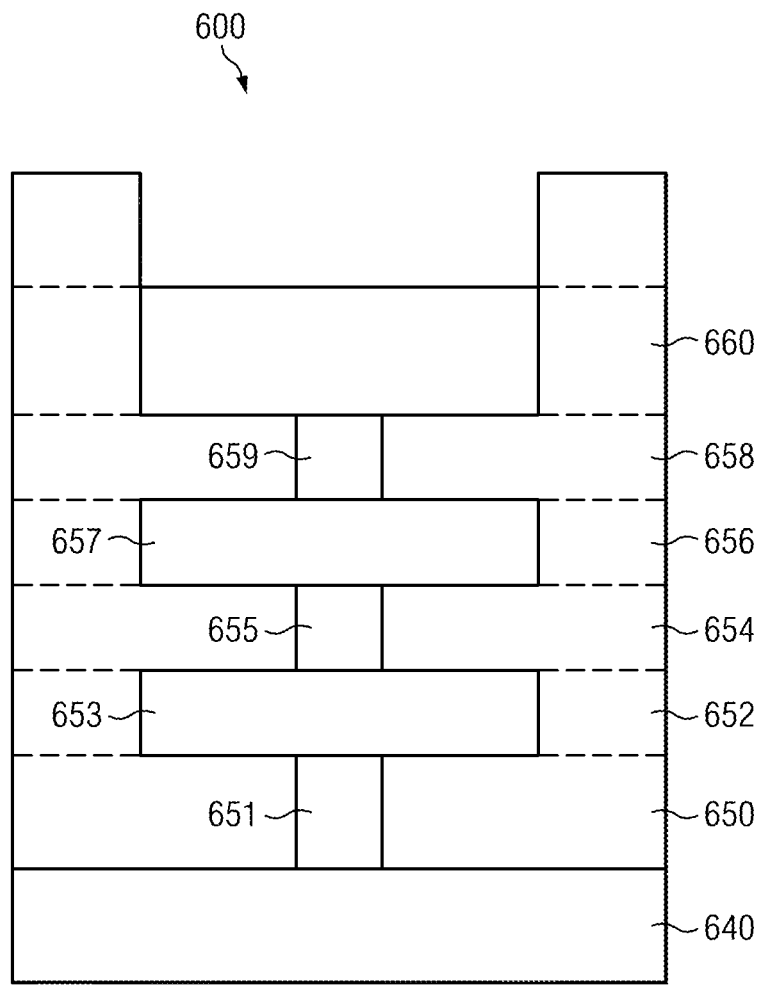
FIG. 8 shows a cross sectional view of a crack stop barrier.

FIG. 8 shows a cross-sectional view of an embodiment of a crack stop barrier 600 in a kerf or scribe line 300. The crack stop barrier 600 may be made of several isolation layers 650-660. Each isolation layer may comprise an isolation material and a crack stop material or solid material. The isolation material may be silicon dioxide or a low-k dielectric, for example. The crack stop material may be a conductive material such as a metal, e.g. aluminum (Al), copper (Co), tungsten (W), or polysilicon. Alternatively, the crack stop material may be a dielectric material such as silicon-dioxide, silicon nitride, or a high-k dielectric.

FIG. 8 shows a substrate 640. The substrate 640 may include mono-crystalline silicon, gallium arsenide (GaAs), germanium (Ge), silicon-on-insulator (SOI), or any other substrate material. The substrate 640 is a wafer and may comprise kerf regions.

A first isolation layer 650 is formed over the substrate 640 by known methods. The first isolation layer 650 is patterned to form contact holes or trenches. The contact holes or trenches may be filled with a solid material to form contacts or plugs 651.

A second isolation layer 652 is deposited and patterned to form trenches for depositing solid material lines 653. The solid material lines 653 of the second isolation layer 652 extend into and out of the plane of the page. A third isolation layer 654 is formed and patterned to create vias or trenches which are then filled with a solid material to form plugs or contacts 655. A fourth isolation layer 656 is deposited and patterned to form trenches for depositing solid material lines 657. The solid material lines 657 of the fourth isolation layer 656 extend into and out of the plane of the page. The plugs or contacts 655 physically connect the solid material lines 657 of the fourth isolation layer 656 with the solid material lines 653 of the second isolation layer 652.

Advantageously, multiple levels of isolation layers 650-658 may be deposited to form the crack stop barrier 600. The crack stop barrier 600 may be created by alternating forming isolation layers 652-656 having solid material lines 653-657 and isolation layers 650-656 having plugs, contacts or trenches 651-659 comprising the solid material. The crack stop barrier 600 may be passivated by a passivation layer 660.

FIG. 8 shows only one row of plugs or contacts 655 physically connecting solid material line 653 to solid material line 657. In one embodiment two or more parallel rows of plugs or contacts 655 may be formed to physically connect solid material line 653 to solid material line 657 (not shown). In one embodiment the crack stop barrier 600 may be a dual barrier line. In one embodiment each barrier line of the dual barrier line crack stop barrier 600 may comprise the same material, width, and design as the single line crack stop barrier. In another embodiment each line of the dual barrier line of the crack stop barrier 600 may comprise different materials, widths and/or designs. Alternatively, the crack stop barrier 600 may be a single barrier line or a multi barrier line.

The crack stop barrier 600 may comprise a pyramid type structure with a width of the solid material lines 653-657 being smaller in the top levels than in the bottom levels. For example, first solid material lines 653 may comprise a first thickness, and second solid material lines 657 may comprise a second thickness. The second thickness is the same or less than the first thickness. The crack stop barrier 600 may comprise cube type structure with a width of the solid material lines 653-657 being the same in all layers.

The crack stop barrier 600 is formed on a wafer. The semiconductor wafer 640 may comprise kerf regions 300 and chip or die regions 200. A chip design may be applied or processed through a back end of line (BEOL) manufacturing process to the chip regions 200. A kerf design may be applied or processed through a BEOL manufacturing process to the kerf regions 300. The chip design and the kerf design may be two differently created designs.

The chip design may comprise crack stop barriers and the kerf design may comprise crack stop barriers. The chips, processed according to the chip design, may comprise a crack stop barrier along an outer rim of the chips. The crack stop barriers of the chips may form a ring around an integrated circuit. The crack stop barrier may seal the chip protecting it against cracks and moister.

The kerf design may comprise crack stop barriers in a kerf 300, in a kerf junction 400 or in the vicinity of a kerf junction 400. In one embodiment the crack stop barrier may be arranged orthogonal to a first kerf direction and parallel to a second kerf direction. In one embodiment the crack stop barriers may be arranged orthogonal to a first kerf direction and orthogonal to a second kerf direction. The crack stop barriers may be arranged along opposite sides of a kerf junction. The crack stop barrier may be arranged along a perimeter of the kerf junction 400. The crack stop barrier may be arranged at a distance inside the perimeter of the kerf junction 400 or may be arranged at a distance outside the perimeter of the kerf junction 400.

Although the present invention and its advantages have been described in detail, it should be understood that various changes, substitutions and alterations can be made herein without departing from the spirit and scope of the invention as defined by the appended claims. For example, many of the features and functions discussed above can be implemented in a capacitor manufacturing process having a lower electrode, a dielectric and an upper electrode. As another example, it will be readily understood by those skilled in the art that the novel process steps may be applied to any structure which has two conductive layers next to one another and that the process steps may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a chip;
   a first kerf adjacent the chip and having a first main direction;
   a second kerf adjacent the chip and having a second main direction;
   a kerf junction formed by the first kerf and the second kerf, the kerf junction comprising a first width along the first main direction and a second width along the second main direction;
   a first crack stop barrier located at least partially within the kerf junction, the first crack stop barrier oriented along the first main direction and having a first length along the first main direction; and
   a second crack stop barrier proximate the kerf junction, the second crack stop barrier oriented along the second main direction and having a second length along the second main direction, wherein the first length is longer than the first width, and wherein the second length is shorter than the second width.

2. The structure of claim 1, wherein the first main direction is along a first side of the chip.

3. The structure of claim 1, wherein the second main direction is along a second side of the chip.

4. The structure of claim 1, wherein the first main direction is perpendicular to the second main direction.

5. The structure of claim 1, wherein the first crack stop barrier comprises a plurality of isolation layers disposed over a substrate, wherein alternating ones of the plurality of isolation layers comprise a solid material line and the remaining ones of the plurality of isolations layers comprise a plug coupled to the solid material line.

6. The structure of claim 5, wherein the solid material line comprises a conductive material.

7. The structure of claim 5, wherein the solid material line comprises a dielectric material.

8. The structure of claim 5, wherein a width of the solid material lines in the alternating ones of the plurality of isolation layers is the same in all of the alternating ones of the plurality of isolation layers.

9. A semiconductor structure comprising:
   a chip;
   a first kerf adjacent the chip and having a first main direction;
   a second kerf adjacent the chip and having a second main direction;
   a kerf junction formed by the first kerf and the second kerf; and
   a first crack stop barrier extending at least partially into the first kerf and the kerf junction, the first crack stop barrier being oriented along the first main direction;
   a second crack stop barrier located at least partially into the first kerf and the kerf junction, the second crack stop barrier oriented along the first main direction; and
   a third crack stop barrier extending between the first and the second crack stop barriers and being proximate the kerf junction, the third crack stop barrier being oriented along the second main direction, the third crack stop barrier not contacting the first crack stop barrier and the second crack stop barrier.

10. The structure of claim 9, wherein the first main direction is perpendicular to the second main direction.

11. The structure of claim 9, wherein the first crack stop barrier comprises a plurality of isolation layers disposed over a substrate, wherein alternating ones of the plurality of isolation layers comprise a solid material line and the remaining ones of the plurality of isolations layers comprise a plug coupled to the solid material line.

12. The structure of claim 11, wherein the solid material line comprises a conductive material.

13. The structure of claim 11, wherein the solid material line comprises a dielectric material.

14. The structure of claim 11, wherein a width of the solid material lines in the alternating ones of the plurality of isolation layers is the same in all of the alternating ones of the plurality of isolation layers.

15. The structure of claim 9, wherein the kerf junction comprises a first width along the first main direction and a second width along the second main direction, and wherein the first crack stop barrier has a first length along the first main direction, and the third crack stop barrier has a second length along the second main direction, wherein the first length is longer than the first width, and wherein the second length is shorter than the second width.

16. A semiconductor structure, comprising:
   a chip;
   a first kerf adjacent the chip and having a first main direction;
   a second kerf adjacent the chip and having a second main direction;

a kerf junction formed by the first kerf and the second kerf, the kerf junction comprising a first width along the first main direction and a second width along the second main direction;

a first crack stop barrier located in the first kerf, the first crack stop barrier oriented along the first main direction and having a first length along the first main direction; and a second crack stop barrier located within the second kerf, the second crack stop barrier oriented along the second main direction and having a second length along the second main direction, wherein the first length is longer than the first width, and wherein the second length is shorter than the second width.

17. The structure of claim 16, wherein the first main direction is perpendicular to the second main direction.

18. The structure of claim 16, wherein the first crack stop barrier comprises a plurality of isolation layers disposed over a substrate, wherein alternating ones of the plurality of isolation layers comprise a solid material line and the remaining ones of the plurality of isolations layers comprise a plug coupled to the solid material line.

19. The structure of claim 18, wherein the solid material line comprises a conductive material.

20. The structure of claim 18, wherein the solid material line comprises a dielectric material.

21. The structure of claim 18, wherein a width of the solid material lines in the alternating ones of the plurality of isolation layers is the same in all of the alternating ones of the plurality of isolation layers.

22. A semiconductor device, comprising:

a chip having a first side and a second side that intersect at a corner;

a first peripheral region comprising a remaining portion of a first scribe line adjacent the first side of the chip and having a first main direction;

a second peripheral region comprising a remaining portion of a second scribe line adjacent the second side of the chip and having a second main direction;

a junction formed by the first scribe line and the second scribe line;

a first crack stop barrier extending away from the chip from the corner along the first main direction and located at least partially in the second scribe line; and a second crack stop barrier extending away from the chip from the corner along the second main direction, the first crack stop barrier not contacting the second crack stop barrier, wherein the junction comprises a first width along the first main direction and a second width along the second main direction, the first crack stop barrier has a first length along the first main direction, wherein the second crack stop barrier has a second length along the second main direction, and wherein the first length is longer than the second length.

23. The device of claim 22, wherein the first crack stop barrier is spaced at a first distance from the corner, the second crack stop barrier is spaced at a second distance from the corner, and the second distance is different from the first distance.

24. The device of claim 22, wherein the first main direction is perpendicular to the second main direction.

25. The device of claim 22, wherein the first crack stop barrier comprises a plurality of isolation layers disposed over a substrate, wherein alternating ones of the plurality of isolation layers comprise a solid material line and the remaining ones of the plurality of isolations layers comprise a plug coupled to the solid material line, wherein a width of the solid material lines in the alternating ones of the plurality of isolation layers is the same in all of the alternating ones of the plurality of isolation layers.

* * * * *